(12) United States Patent
 Chang

(10) Patent No.: US 12,690,703 B2
(45) Date of Patent: Jul. 28, 2026

(54) NECK PILLOW

(71) Applicants: Hyundai Motor Company, Seoul (KR); Kia Corporation, Seoul (KR)

(72) Inventor: Kyoung Jin Chang, Suwon (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 993 days.

(21) Appl. No.: 17/513,512

(22) Filed: Oct. 28, 2021

(65) Prior Publication Data

US 2022/0330731 A1 Oct. 20, 2022

(30) Foreign Application Priority Data

Apr. 15, 2021 (KR) .......................... 10-2021-0048914

(51) Int. Cl.
 *A47G 9/10* (2006.01)
 *A47C 7/38* (2006.01)
 (Continued)

(52) U.S. Cl.
 CPC ............ *A47G 9/1027* (2013.01); *A47C 7/383* (2013.01); *A47G 9/1081* (2013.01); *A61H 23/02* (2013.01);
 (Continued)

(58) Field of Classification Search
 CPC ................ A47G 9/1027; A47G 9/1081; A47G 2009/1018; A61H 23/02; A61H 23/0254;
 (Continued)

(56) References Cited

U.S. PATENT DOCUMENTS 5,218,960 A * 6/1993 Privas .................. A61H 39/002
 607/58
6,179,797 B1 * 1/2001 Brotz ................. A61H 33/6089
 601/150
(Continued)

FOREIGN PATENT DOCUMENTS

CN 101378932 A 3/2009
CN 109044790 A * 12/2018 ........... A61H 23/006
 (Continued)

OTHER PUBLICATIONS

Office Action issued Feb. 10, 2025 in corresponding Korean Patent Application No. 10-2021-0048914.
(Continued)

*Primary Examiner* — Tu A Vo
*Assistant Examiner* — Kelsey E Baller
(74) *Attorney, Agent, or Firm* — Fox Rothschild LLP

(57) ABSTRACT

A neck pillow includes: a cushion portion worn on a user's neck and an electro-liquid driving unit mounted into the cushion portion, being bent in a shape of an arc, and including ferroelectric particles, each having an electrorheological property, and nonconductive liquid. The electro-liquid driving unit generates vibration by contraction and expansion that are repeated when an arrangement of the ferroelectric particles and the nonconductive liquid is changed according to whether drive current is applied. A low voltage power supply unit supplies low voltage electricity necessary to drive the electro-liquid driving unit and a high voltage control circuit unit converts low voltage direct current into high voltage direct current and supplies the drive current to the electro-liquid driving unit and adjusting micro-current to generate target vibration in the electro-liquid driving unit.

14 Claims, 8 Drawing Sheets

(51) Int. Cl.
    *A61H 23/02*        (2006.01)
    *A61H 39/00*        (2006.01)
    *H02M 3/00*        (2006.01)
    *H03K 17/78*        (2006.01)

(52) U.S. Cl.
    CPC .... *A61H 39/007* (2013.01); *A61H 2201/0134*
        (2013.01); *A61H 2201/1609* (2013.01); *H02M*
        *3/00* (2013.01); *H03K 17/78* (2013.01)

(58) Field of Classification Search
    CPC .... A61H 39/007; A61H 39/002; A61H 39/04;
        A61H 2201/0134; A61H 2201/1609;
        A61H 2201/50; A61H 1/00; A61H
        2205/04; H02M 3/00; H02M 1/007;
        H03K 17/78; H03K 17/795; A47C 7/383;
        A47C 16/00; B06B 1/20; B60N
        2002/899; B60N 2/976
    See application file for complete search history.

(56) References Cited

U.S. PATENT DOCUMENTS

| | | | | |
|---|---|---|---|---|
| 6,929,612 | B2 * | 8/2005 | Mangano | A61H 23/0263 |
| | | | | 601/72 |
| 7,725,962 | B1 * | 6/2010 | Smith | A45D 44/10 |
| | | | | 4/523 |
| 2007/0188004 | A1 * | 8/2007 | Browne | A47C 7/38 |
| | | | | 297/391 |
| 2007/0200417 | A1 * | 8/2007 | York | A47C 7/18 |
| | | | | 297/452.55 |
| 2007/0246979 | A1 | 10/2007 | Browne et al. | |
| 2008/0229498 | A1 * | 9/2008 | Grosso | A47C 7/383 |
| | | | | 5/244 |
| 2011/0251526 | A1 * | 10/2011 | Kim | A45D 44/00 |
| | | | | 601/2 |
| 2017/0348181 | A1 * | 12/2017 | Perriard | A43B 13/189 |
| 2019/0059511 | A1 * | 2/2019 | Walker | A43B 3/34 |
| 2019/0262225 | A1 * | 8/2019 | Gertner | A61H 39/007 |

FOREIGN PATENT DOCUMENTS

| | | | | | |
|---|---|---|---|---|---|
| CN | 111973405 | A | * | 11/2020 | A61H 3/00 |
| CN | 112933432 | A | * | 6/2021 | A61N 5/10 |
| DE | 19628228 | A1 | * | 1/1998 | A47C 31/126 |
| KR | 10-1357400 | B1 | | 2/2014 | |
| KR | 10-2021-0000626 | A | | 1/2021 | |

OTHER PUBLICATIONS

Office action dated Apr. 23, 2026 for corresponding Chinese patent application No. 202111367841.2, Chinese Patent Office.

* cited by examiner

NECK PILLOW

CROSS REFERENCE TO RELATED APPLICATION

The present application claims priority to Korean Patent Application No. 10-2021-0048914, filed Apr. 15, 2021, the entire contents of which is incorporated herein for all purposes by this reference.

BACKGROUND OF THE DISCLOSURE

Field of the Disclosure

The present disclosure relates to a technology for a neck pillow used in a vehicle or in everyday life and, more particularly, to a technology for a neck pillow that provides smooth comfortable acupressure and massage to the user without causing mechanical vibration and noise.

Description of the Related Art

Motor-operated neck pillows have been developed that provides vibration and a massage effect, as well as serve as neck pillows used in vehicles or in everyday life. The motor-operated neck pillows in the related art generate vibration using a motor and provides an acupressure effect by operating a mechanical mechanism.

This structure that generates the vibration and provides the acupressure and massage effects using the motor and the mechanical mechanism has the advantage of providing the vibration having a comparatively large exciting force and the acupressure effect. However, mechanical vibration occurs since the vibration is generated and the acupressure effect is provided using mechanical components each having a gearwheel. The disadvantage of the motor-operated neck pillow is that a user experiences inconvenience and a sense of uneasiness due to the mechanical vibration and particularly discomfort due to noise caused by a mechanical operation.

Therefore, there is a need to develop a neck pillow in which the motor and the mechanical components each having the gearwheel are replaced to prevent the user from experiencing the convenience and the sense of uneasiness and particularly the noise caused by the mechanical operation when using the neck pillow generating the vibration and providing the acupressure and the message.

The foregoing is intended merely to aid in the understanding of the background of the present disclosure, and is not intended to mean that the present disclosure falls within the purview of the related art that is already known to those skilled in the art.

SUMMARY OF THE DISCLOSURE

An objective of the present disclosure is to provide a neck pillow capable of generating vibration and providing a smoother comfortable acupressure and massage to a user by controlling ferroelectric particles each having an electrorheological property and a flow of nonconductive liquid.

According to an aspect of the present disclosure, a neck pillow may include: a cushion portion being worn on a user's neck; an electro-liquid driving unit built into the cushion portion, bent in a shape of an arc according to a shape of the user's neck to surround the neck, and including ferroelectric particles, each having an electrorheological property, and nonconductive liquid, the ferroelectric particles and the nonconductive liquid being fixed in one space, the electro-liquid driving unit configured to generate vibration by contraction and expansion that are repeated when an arrangement of the ferroelectric particles and the nonconductive liquid is changed according to whether drive current is applied; a low voltage power supply unit configured to supply low voltage electricity necessary to drive the electro-liquid driving unit; and a high voltage control circuit unit configured to convert low voltage direct current of the low voltage power supply unit into high voltage direct current and to supply the drive current to the electro-liquid driving unit, and to adjust micro-current in such a manner that target vibration is generated in the electro-liquid driving unit.

In the neck pillow, the cushion portion may be filled with a forming material made of polymer and a filler made of fiber to provide absorption and support when worn on the user's neck. In addition, in the neck pillow, the electro-liquid driving unit may include: a liquid bag with the ferroelectric particles, each having the electrorheological property, and the nonconductive liquid being mixed in one space in the liquid bag; a plurality of positive electrodes being installed to be brought into contact with a first surface of the liquid bag and being arranged at a predetermined distance away from each other along a longitudinal direction of the liquid bag; a plurality of negative electrodes being installed to be brought into contact with a second surface of the liquid bag while facing the plurality of positive electrodes, respectively; a plurality of springs being installed on the plurality of negative electrodes, respectively, for support thereof, being pressed and thus becoming smaller in length when current is supplied to the positive electrodes and the negative electrodes and thus an electric field is applied, and being released and thus returning to an original length thereof when the electric field is no longer applied, with the repeated pressing and releasing of the spring causing the liquid bag to repeatedly contract and expand; and a positive electrode lead line connecting the positive electrodes to the high voltage control circuit unit; and a negative electrode lead line connecting the negative electrodes to the high voltage control circuit unit.

In the neck pillow, the liquid bag may be maintained bent in the shape of the arc according to the shape of the user's neck in a state where the liquid bag is built into the cushion portion and may be divided into an electric field region where the positive electrode and the negative electrode are brought into contact with each other and a nonelectric field region where the positive electrode and the negative electrode are not brought into contact with each other, with the nonelectric field region being expanded when the current is applied to the positive electrodes and the negative electrodes and thus the electric field is applied, thereby bringing the nonelectric field region into contact with the user's neck.

The liquid bag may be maintained bent in the shape of the arc according to the shape of the user's neck in a state where the liquid bag is built into the cushion portion and may be divided into an electric field region where the positive electrode and the negative electrode are brought into contact with each other and a nonelectric field region where the positive electrode and the negative electrode are not brought into contact with each other, and the electric field region may vibrate the user's neck to increase an exciting force that the user feels when the current is applied to the positive electrodes and the negative electrodes and thus the electric field is applied, with the positive electrodes and the negative electrodes being arranged in such a manner as not to face the user's neck.

When a state is entered where the current is not supplied to the positive electrodes and the negative electrodes, the ferroelectric particles may maintain a liquid state, the electric field region where the positive electrode and the negative electrode are brought into contact with each other may maintain a state of contracting due to a restoring force of the spring, and the nonelectric field region where the positive electrode and the negative electrode are not brought into contact with each other may maintain a state of expanding as much as the electric field region contracts.

When the current is supplied to the positive electrodes and the negative electrodes and thus the electric field is applied, the ferroelectric particles may be pulled toward the positive electrodes and the negative electrodes, and thus negative (−) components of the ferroelectric particles may be arranged in a direction of the positive electrodes, positive (+) components thereof may be arranged in a direction of the negative electrodes, and the ferroelectric particles may be arranged in a row as in a chain structure due to an electrostatic force between the ferroelectric particles. Accordingly, a phase of the ferroelectric particle may change from liquid to solid, and thus the electric field region where the positive electrode and the negative electrode are brought into contact with each other may expand due to the ferroelectric particle of which the phase changes to solid, and the nonelectric field region may enter the state of contracting because the nonconductive liquid is pushed toward the nonelectric field region where the positive electrode and the negative electrode are not brought into contact with each other.

In addition, control of current by the high voltage control circuit unit may cause the electric field region and the nonelectric field region to repeatedly expand and contract, and thus vibration may occur in the liquid bag and the vibration of the liquid bag may propagate to the user's neck, thereby providing acupressure and massage to the user's neck. The electro-liquid driving unit may further include an electrode support being connected to the positive electrodes and thus supporting the positive electrodes and restricting expansion displacement of the liquid bag positioned between the positive electrode and the negative electrode when the current is supplied to the positive electrodes and the negative electrodes and thus the electric field is applied. The electrode support may be formed of any one of nonconductive metal or plastic.

The electro-liquid driving unit may further include: a support arranged in the longitudinal direction of the liquid bag and serving as a frame that provides a repulsive force against a force from the spring and the electrode support and to support the entire electro-liquid driving unit when the electric field is applied to the positive electrodes and the negative electrodes and is no longer supplied thereto, with the spring and the electrode support being connected to the support. The support may be formed in a shape of a bar or as a panel having a predetermined thickness and may be kept maintained in the shape of the arc according to the shape of the user's neck in a state where the support is built into the cushion portion, with the support being formed of a metal material and providing a grounding path after being connected to the negative electrodes.

The high voltage control circuit unit may include: a high voltage DC-to-DC converter configured to convert low voltage direct current supplied from the low voltage power supply unit into high voltage direct current and to supply to the electro-liquid driving unit the drive current necessary to drive the electro-liquid driving unit; an opto-isolator rapidly allowing or blocking a flow of an electric signal using an optical element to allow or block a flow of the high voltage current resulting from the conversion in the high voltage DC-to-DC converter; and a microcontroller configured to generate a control signal for allowing or blocking a flow of micro-current in accordance with a frequency of a signal for the target vibration in such a manner that the target vibration occurs in the electro-liquid driving unit. The neck pillow may be provided as a vehicle neck pillow mounted between a vehicle seat and a headrest or as a neck pillow mounted on a chair for massage.

The neck pillow according to the present disclosure may be installed between a vehicle seat and a headrest and be used to protect an occupant's neck. Alternatively, the neck pillow may be used in everyday life as an accessory to protect the user's neck. The neck pillow may generate vibration and provide smooth comfortable acupressure and massage to the user by adjusting the flow of liquid having the electrorheological property.

Particularly, inconvenience and a sense of uneasiness that the user experiences and mechanical noise can be eliminated because a motor and a mechanical operation mechanism are not used. Thus, the advantage of improving the marketability of the neck pillow may be achieved. In addition, the neck pillow according to the present disclosure is configured to generate vibration and provide acupressure and massage using liquid. Thus, the advantage of giving a sense of soft touch to the user can be achieved.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE DISCLOSURE

Figure 1:
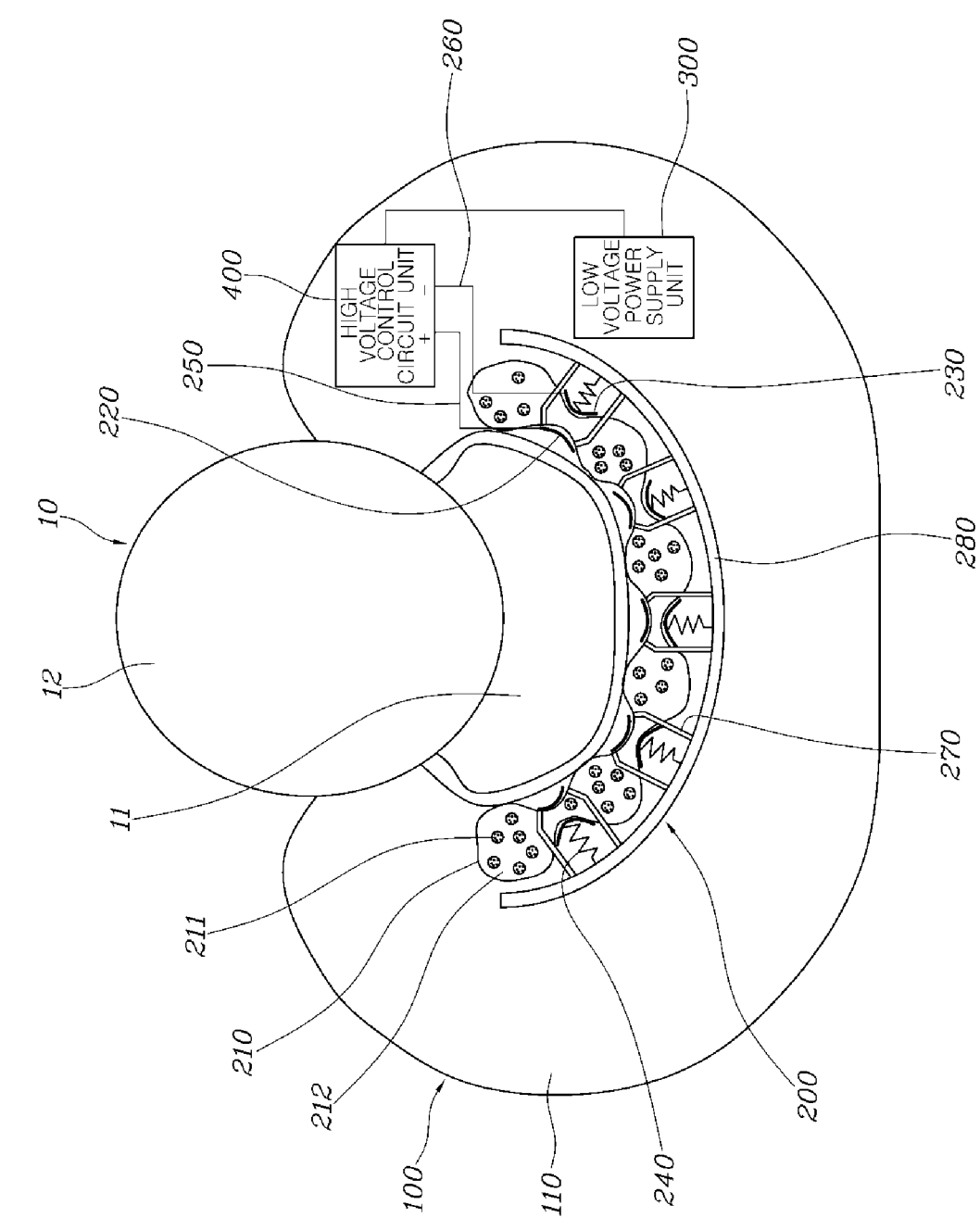
FIG. 1 is a view illustrating a state where a neck pillow according to the present disclosure is worn on a user's neck.
Figure 2:
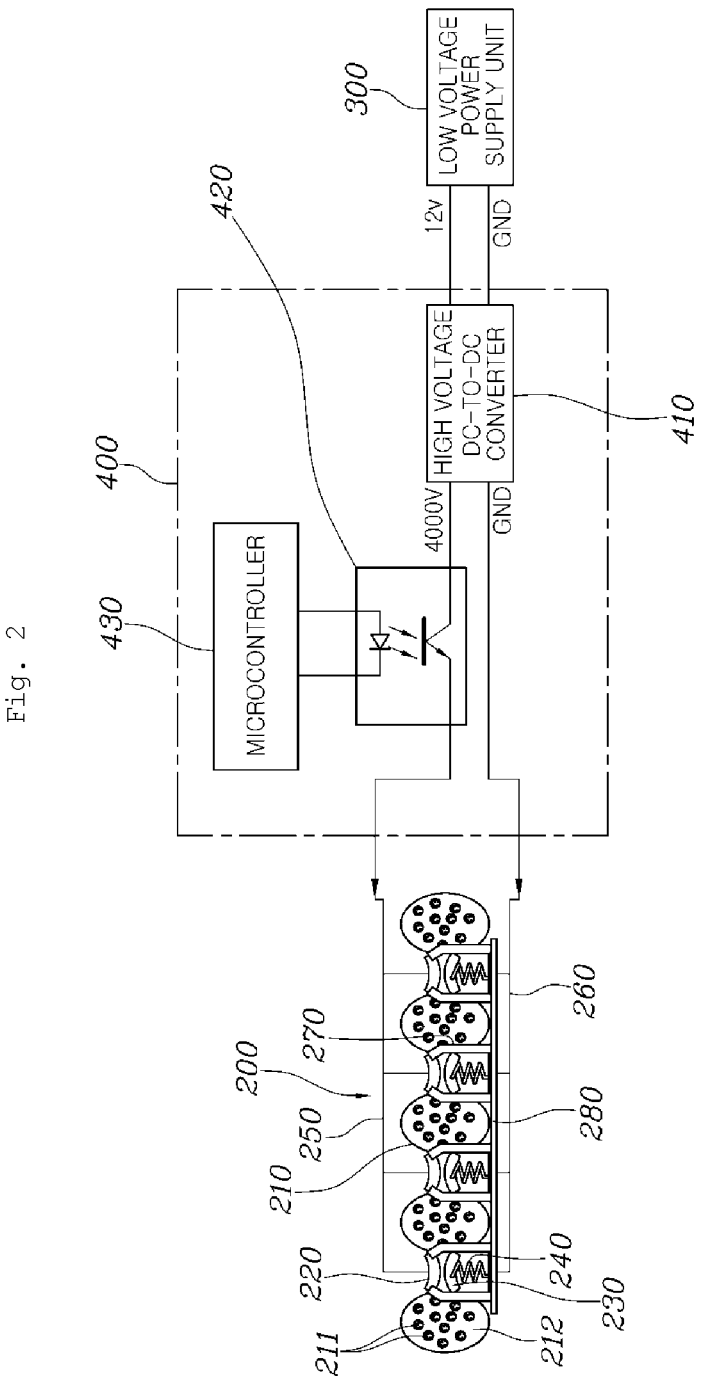
FIG. 2 is a view illustrating a configuration of the neck pillow according to the present disclosure.

Exemplary embodiments of the present disclosure that are disclosed in the present specification or application will be described in terms of specific structures and functions for the purpose of providing an easy understanding thereof. However, the embodiments of the present disclosure may be implemented in various forms, and the present disclosure should not be construed as being limited to the embodiments described in the present specification or application.

Various modifications may be made in various ways to the embodiments of the present disclosure. Among these, specific embodiments will be described in detail below with reference to the accompanying drawings. However, this description is not intended to limit the technical idea of the present disclosure to specifically disclosed embodiments. All alterations, equivalents, and substitutes that do not depart from the technical idea of the present disclosure should be understood as falling within the scope of the present disclosure.

The terms first, second, and so on may be used to describe various constituent elements, but should not be construed to impose any limitation on the meanings of the constituent elements. Those terms are only used to distinguish one constituent element from another. For instance, a first constituent element may be termed a second constituent element without departing from the scope of each claim that defines the present disclosure. Likewise, the second constituent element may also be termed the first constituent element.

It should be understood that, when a constituent element is referred to as being "coupled to" or "connected to" a different constituent element, this means that the constituent element may be coupled to or connected to the different constituent element or means that an intervening constituent element may be present therebetween. In contrast, it should be understood that, when a constituent element is referred to as being "directly coupled to" or "directly connected to" a different constituent element, this means that no intervening constituent element is present therebetween. This is true for expressions describing a relationship between constituent elements. For example, expressions such as "between" and "directly between" and expressions such as "adjacent to" and "directly adjacent to" should also be construed in the same manner.

The terms used throughout the present specification are only for describing specific embodiments and are not intended to impose any limitation on the present disclosure. The indefinite article "a/an" is used to mean "one or more", not only one, except as distinctively expressed in context. It should be understood that, throughout the present specification, the term "include", "have", or the like is intended to indicate that a feature, a number, a step, an operation, a constituent element, a component, or any combination thereof is present, without precluding the presence or addition of one or more other features, numbers, steps, operations, constituent elements, or any combination thereof.

Unless otherwise defined, each of all terms used throughout the present specification, including technical or scientific terms, has the same meaning as is normally understood by a person of ordinary skill in the art to which the present disclosure pertains. The term as defined in commonly used dictionaries should be construed as having the same contextual meaning as that in the related art and, unless otherwise explicitly defined in the present specification, should not be construed as having an excessively implied meaning or a purely literal meaning.

A control unit (controller) according to an exemplary embodiment of the present disclosure is realized by a nonvolatile memory (not illustrated) and a processor (not illustrated). The nonvolatile memory is configured to store data associated with an algorithm developed to control operation of each of various components of a vehicle or with a software command for executing the algorithm. The processor is configured to perform a below-described operation using the data stored in the memory. The memory and the processor here are realized as individual chips. Alternatively, the memory and the processor may be realized as a single integrated chip. The processor may be configured to include one or more processors.

A neck pillow according to a preferred embodiment of the present disclosure will be described below with reference to the accompanying drawings.

The neck pillow according to the present disclosure may be installed between a vehicle seat and a headrest and be used to protect an occupant's neck. Alternatively, the neck pillow may be used in everyday life as an accessory to protect a user's neck. The neck pillow is configured to generate vibration and provide smooth comfortable acupressure and massage to a user by controlling ferroelectric particles, each having an electrorheological property, and a flow of nonconductive liquid.

In other words, the neck pillow according to the present disclosure, as illustrated in FIGS. 1 to 8, may include a cushion portion 100, an electro-liquid driving unit 200, a low voltage power supply unit 300, and a high voltage control circuit unit 400. The cushion portion 100 may be worn on or around a user 10's neck 11. The electro-liquid driving unit 200 may be built or mounted into the cushion portion 100 and is bent in the shape of an arc according to a shape of the user 10's neck 11 to surround the neck 11. The electro-liquid driving unit 200 may include ferroelectric particles 211, each having an electrorheological property, and nonconductive liquid 212. The ferroelectric particle 211 and the nonconductive liquid 212 are fixed in one space.

The electro-liquid driving unit 200 may be configured to generate vibration by contraction and expansion that are repeated when an arrangement of the ferroelectric particles 211 and the nonconductive liquid 212 is changed according to whether or not drive current is applied. The low voltage power supply unit 300 may be configured to supply low voltage electricity necessary to drive the electro-liquid driving unit 200. The high voltage control circuit unit 400 may be configured to convert low voltage direct current of the low voltage power supply unit 300 into high voltage direct current and supply the drive current to the electro-liquid driving unit 200 and adjust micro-current in such a manner that target vibration is generated in the electro-liquid driving unit 200.

The cushion portion 100 may be filled with a forming material made of polymer and a filler 110 made of fiber to provide absorption and support when the user 10 wears the cushion portion 100 on the user 10' neck 11. Reference numeral 12 in FIG. 1 depicts the user 10's head of which a description is omitted.

The low voltage power supply unit 300 may be configured to supply a low voltage of 12 V. The high voltage control circuit unit 400 may be configured to convert a low voltage into a high voltage according to a control logic therein and supply to the electro-liquid driving unit 200 the drive current on which the electro-liquid driving unit 200 operates. The electro-liquid driving unit 200 may operate as a driving unit that generates vibration by repeated contraction and expansion of a liquid bag that occur due to repeated application of the drive current. When the drive current causes an electric field to occur, the ferroelectric particles 211 present between a negative electrode and a positive electrode, which are described below, are arranged in a row due to the electrorheological property thereof, and thus, a space between the electrodes expands. Accordingly, a nonelectric field region, to which the electric field is not applied, contracts. To achieve absorption and support effects of the neck pillow, the cushion portion 100 has a structure in which the cushion portion 100 is filled with the forming material made of polymer or the filler 110 made of fiber.

The electro-liquid driving unit 200 according to the present disclosure may include a liquid bag 210, a plurality of positive (+) electrodes 220, a plurality of negative (−) electrodes 230, a plurality of springs 240, a positive electrode lead line 250, and a negative electrode lead line 260. The ferroelectric particles 211, each having the electrorheological property, and the nonconductive liquid 212 are mixed in one space in the liquid bag 210. The plurality of positive electrodes 220 may be installed to be brought into contact with a first surface of the liquid bag 210 and are arranged a predetermined distance away from each other along a longitudinal direction of the liquid bag 210. The plurality of negative electrodes 230 may be installed to be brought into contact with a second surface of the liquid bag 210 while facing the plurality of positive electrodes 220, respectively.

The plurality of springs may be installed on the plurality of negative electrodes 230, respectively, for support thereof. When current is supplied to the positive electrodes 220 and the negative electrodes 230 and thus an electric field is applied, the spring 240 is pressed and thus becomes smaller in length. When the electric field is no longer applied, the spring 240 is released and thus returns to an original length thereof. The repeated pressing and releasing of the spring 240 cause the liquid bag 210 to repeatedly contract and expand. The positive electrode lead line 250 connects the positive electrodes 220 to the high voltage control circuit unit 400. The negative electrode lead line 260 connects the negative electrodes 230 to the high voltage control circuit unit 400.

The liquid bag 210 is maintained bent in the shape of an arc according to the shape of the user 10's neck 11 in a state where the liquid bag 210 is built or mounted into the cushion portion 100. The liquid bag 210 may be divided into an electric field region where the positive electrode 220 and the negative electrode 230 are brought into contact with each other and a nonelectric field region where the positive electrode 220 and the negative electrode 230 are not brought into contact with each other. When the current is applied to the positive electrodes 220 and the negative electrodes 230 and thus the electric field is applied, the nonelectric field region expands (refer to FIG. 8), thereby bringing the nonelectric field region into contact with the user 10's neck 11.

As another example, a configuration may be employed in which the electric field region vibrates the user 10's neck 11 to increase an exciting force that the user 10 feels when the current is applied to the positive electrodes 220 and the negative electrodes 230 and thus the electric field is applied. In particular, there is a need to prevent the user 10 from experiencing a sense of irritation and a sense of uneasiness when the positive electrodes 220 and the negative electrodes 230 are brought into direct contact with the user 10's neck 11. Accordingly, it is desirable that the positive electrodes 220 and the negative electrodes 230 are arranged in such a manner as not to face the user 10's neck 11, that is, in an upward-downward or vertical direction.

Further, the liquid bag 210 may have one space therein. The one internal space may be filled with the ferroelectric particles 211 and the nonconductive liquid 212 that are mixed together. As in FIG. 1, the liquid bag 210, when built into the cushion portion 100, is bendable into a circular shape in a manner that is suitable for the shape of the neck 11. The liquid bag 210 may have the shape of a longitudinal ellipse. In addition, the liquid bag 210 may be divided into the electric field region to which the electric field is applied and the nonelectric field region to which the electric field is not applied. The liquid bag 210 may be made of a soft material such that the nonelectric region to which the electric field is not applied expands smoothly touches the user 10's neck 11 when expanding. Accordingly, the liquid bag 210 may be made of any one of polyethylene, polypropylene, and polyvinylchloride.

The ferroelectric particle 211 is a smart material having the electrorheological property according to whether the electric field is applied. When the electric field is not applied, the ferroelectric particles 211 are randomly arranged. When the electric field is applied, distributions of positive (+) components and negative (−) components of the ferroelectric particles 211 are changed according to the direction of the electric field. Accordingly, electrostatic attraction occurs between the ferroelectric particles 211. Thus, the ferroelectric particles 211 are arranged as in a chain structure. The change in the structure of the ferroelectric particles 211 occurs reversibly within milliseconds. Accordingly, the ferroelectric particle 211 undergoes a phase change from liquid to solid, and an electrorheological behavior thereof is changed. Examples of ferroelectric particle 211 include polyaniline (PANT), polypyrrole (PPy), polythiophene (PTs), and the like.

The nonconductive liquid 212 is a material that is pushed to the nonelectric field region to which the electric field is not applied and thus cannot expand when the ferroelectric particles 211 are pulled toward the electrodes due to the electric field and thus a specific arrangement thereof is not made. Stable nonconductive liquid, having a low viscosity and a high boiling point, is suitable as the nonconductive liquid 212. Examples of the nonconductive liquid 212 include silicone oil, mineral oil, and the like.

The positive electrode 220 is an electrode at which positive electric potential occurs. When the electric field is applied, the positive electrodes 220 attract negative components of the ferroelectric particles 211 and accordingly serves to arrange the ferroelectric particles 211 in the chain structure due to an electrostatic effect. The positive electrode 220 may be made of metal material having high electrical conductivity, such as aluminum. The positive electrodes 220 are arranged on an upper end of the liquid bag 210 to cover a portion of the electric field region to which the electric field is applied. At this point, the electric field region to which the electric field is applied may be a region that does not touch the user 10's neck 11.

The negative electrode 230 is an electrode at which negative electric potential occurs. When the electric field is applied, the negative electrodes 230 attract positive (+) components of the ferroelectric particles 211 and accordingly serve to arrange the ferroelectric particles 211 in the chain structure due to the electrostatic effect. The positive electrode 230 may be made of a metal material having high electrical conductivity, such as aluminum.

The negative electrodes 230 may be arranged on a lower end of the liquid bag 210 to be symmetrical with the positive electrodes 220 and to cover a portion of the electric field region to which the electric field is applied. At this point, the electric field region to which the electric field is applied may be a region that does not touch the user 10's neck 11.

When the electric field is not applied, the spring 240 restores a volume of the liquid bag 210 corresponding to the electric field region to an original state thereof. Thus, the spring 240 causes the liquid bag 210 to repeatedly contract and expand. The spring 240 may be positioned between the negative electrode 230 and a support 280 described below and stores elastic energy. The spring 240 may be made of an elastic material, such as metal.

An elastic modulus of the spring 240 may be adjusted based on a vibration frequency to be adjusted. When a control frequency is high, a design is needed that increases the elastic modulus such that an entire natural frequency of a system is approximately equal to the control frequency. When the control frequency is low, a design is needed that decreases the elastic modulus.

The positive electrode lead line 250 is a conductive line along which positive electric potential current flows from the high voltage control circuit unit 400 to the positive electrodes 220. The negative electrode lead line 260 is a conductive line along which negative electric potential current flows from the high voltage control circuit unit 400 to the negative electrodes 230. The positive electrode lead line 250 and the negative electrode lead line 260 may be made of copper.

Figure 3:
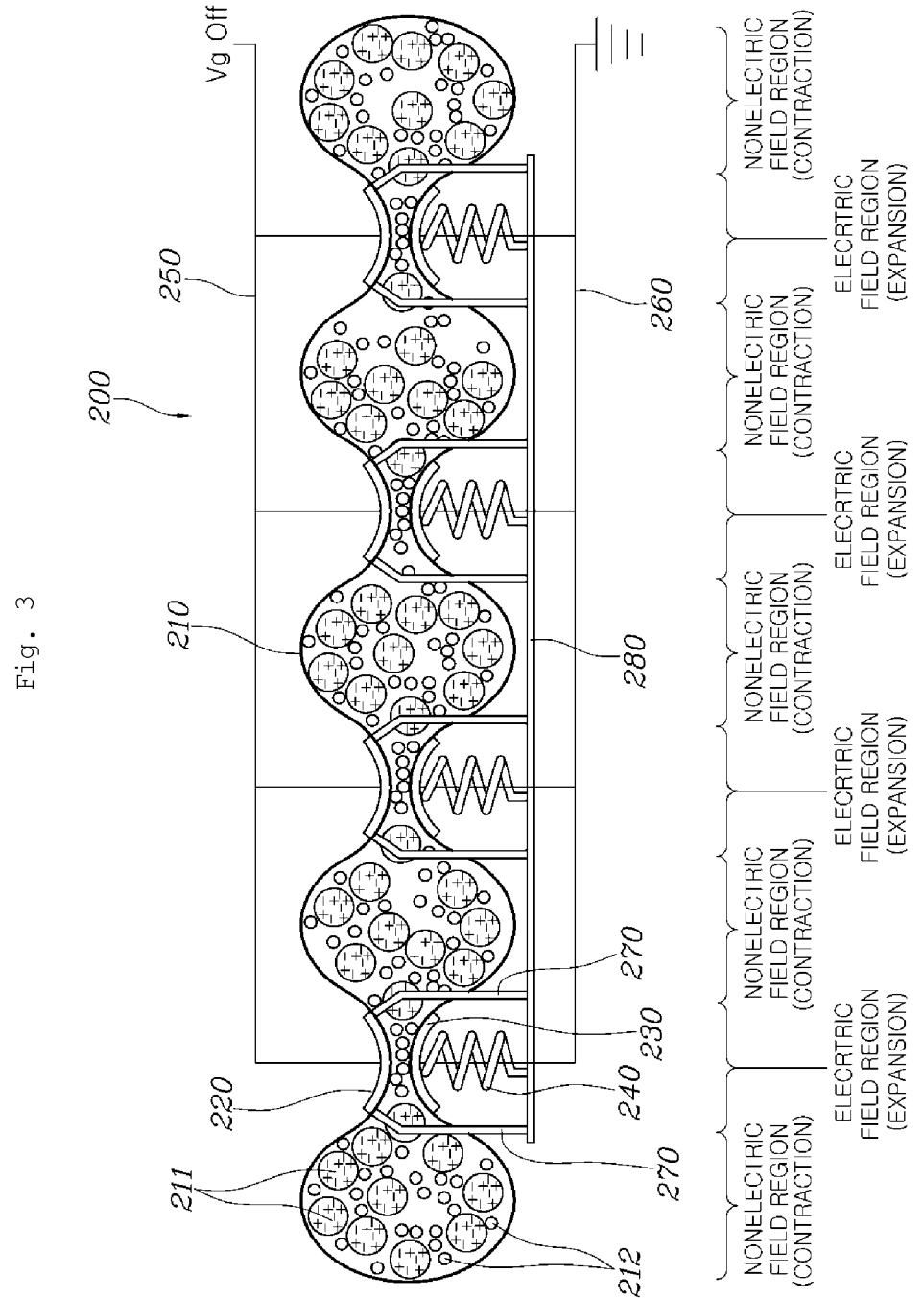
FIG. 3 is a view illustrating an electro-liquid driving unit constituting the neck pillow according to the present disclosure and a state where a magnetic field is not applied to positive electrodes and FIG. 4 is a bottom view illustrating the neck pillow in FIG. 3.
Figure 4:
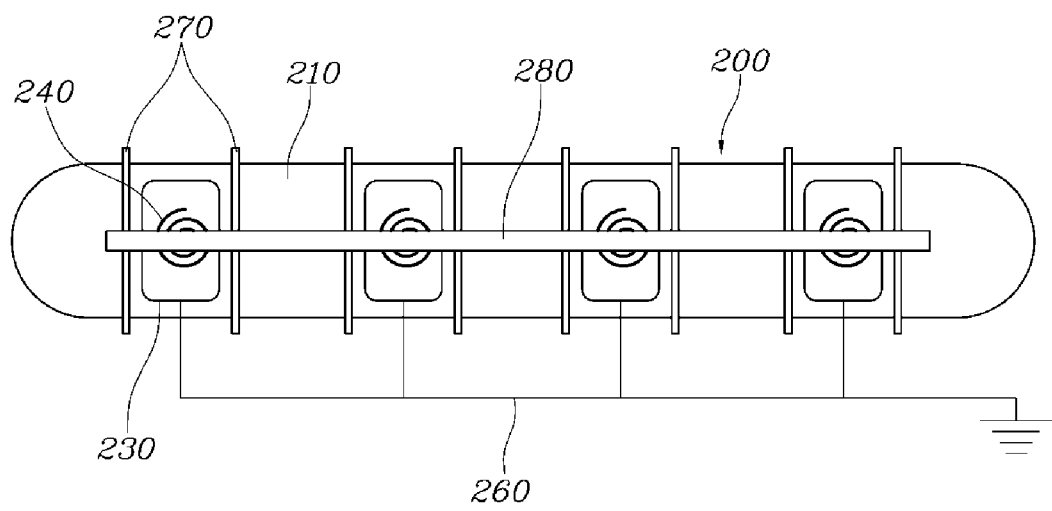
Figure 5:
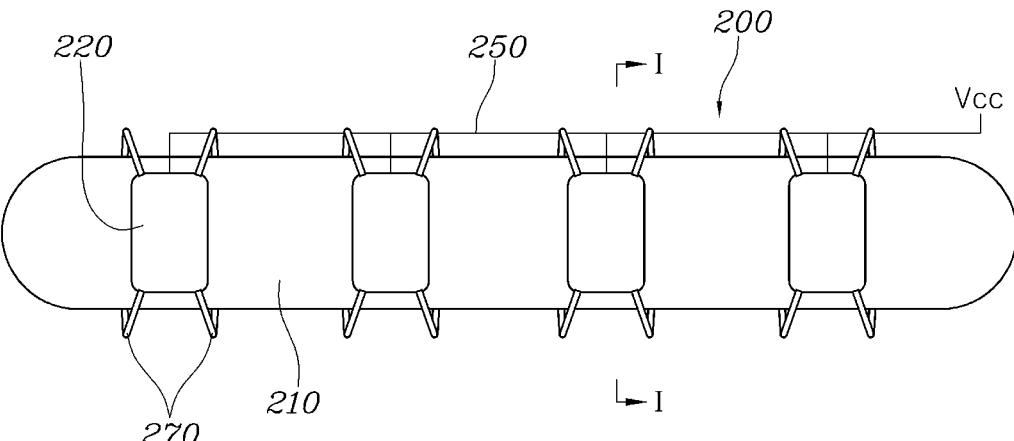
FIG. 5 is a plane view illustrating the neck pillow in FIG. 3.
Figure 6:
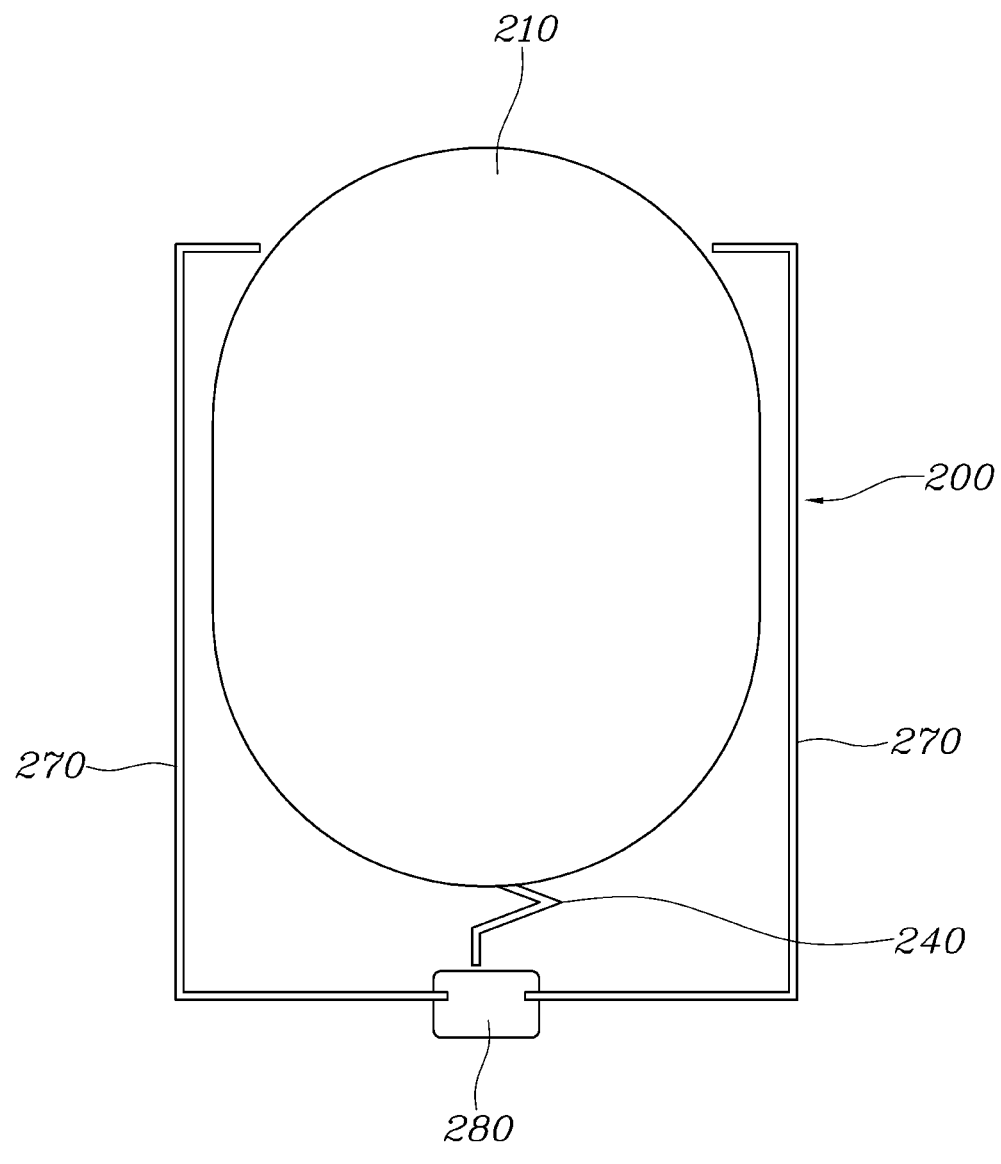
FIG. 6 is a side view illustrating the neck pillow in FIG. 3.
Figure 7:
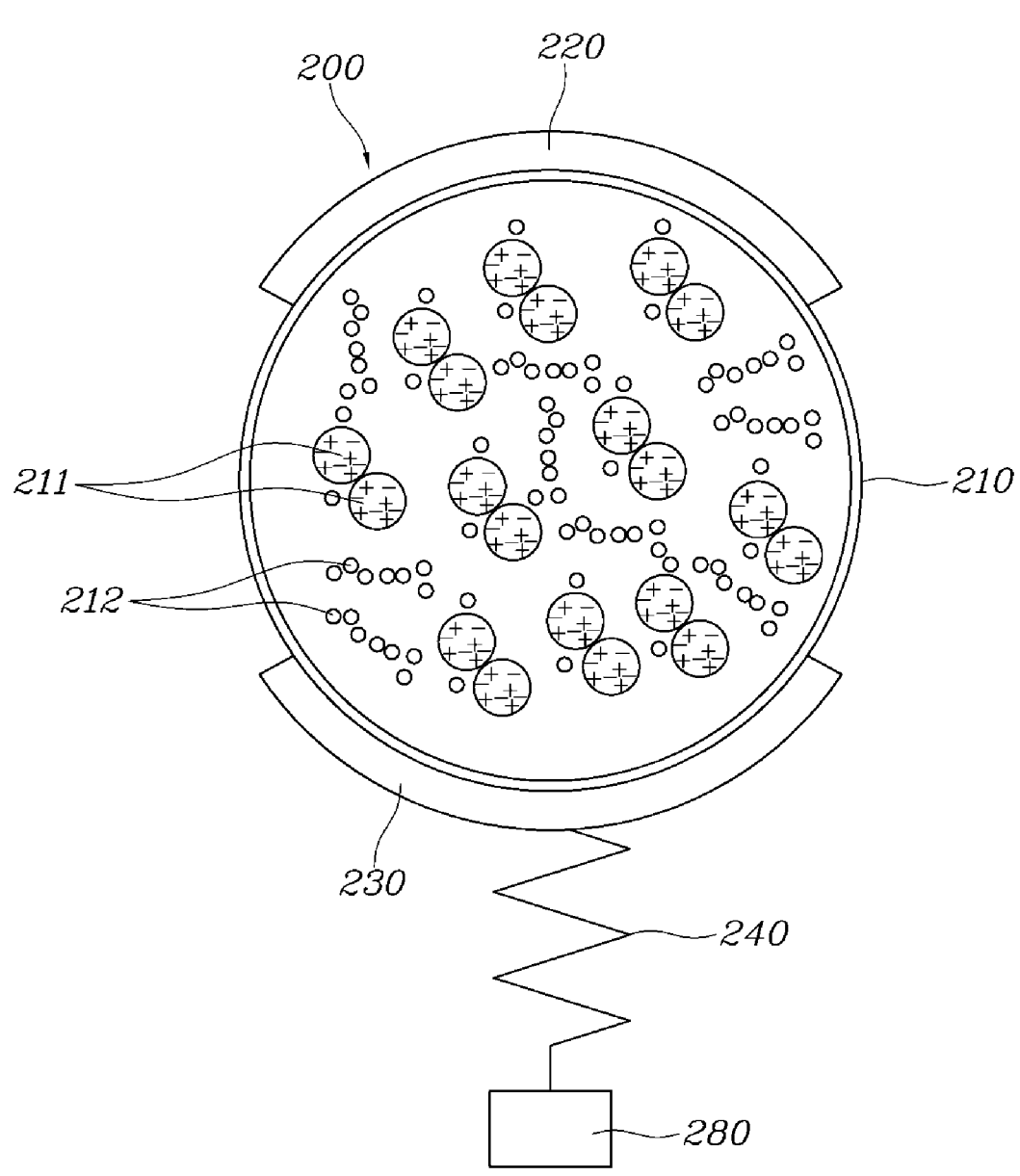
FIG. 7 is a cross-sectional view taken along ling I-I on FIG. 5.

As in FIG. 3, when a state is entered where the current is not supplied to the positive electrodes 220 and the negative electrodes 230, the ferroelectric particles 211 maintain a liquid state, the electric field region where the positive electrode 220 and the negative electrode 230 are brought into contact with each other maintains a state of contracting due to a restoring force of the spring 240, and the nonelectric field region where the positive electrode 220 and the negative electrode 230 are not brought into contact with each other maintains a state of expanding as much as the electric field region contracts.

Figure 8:
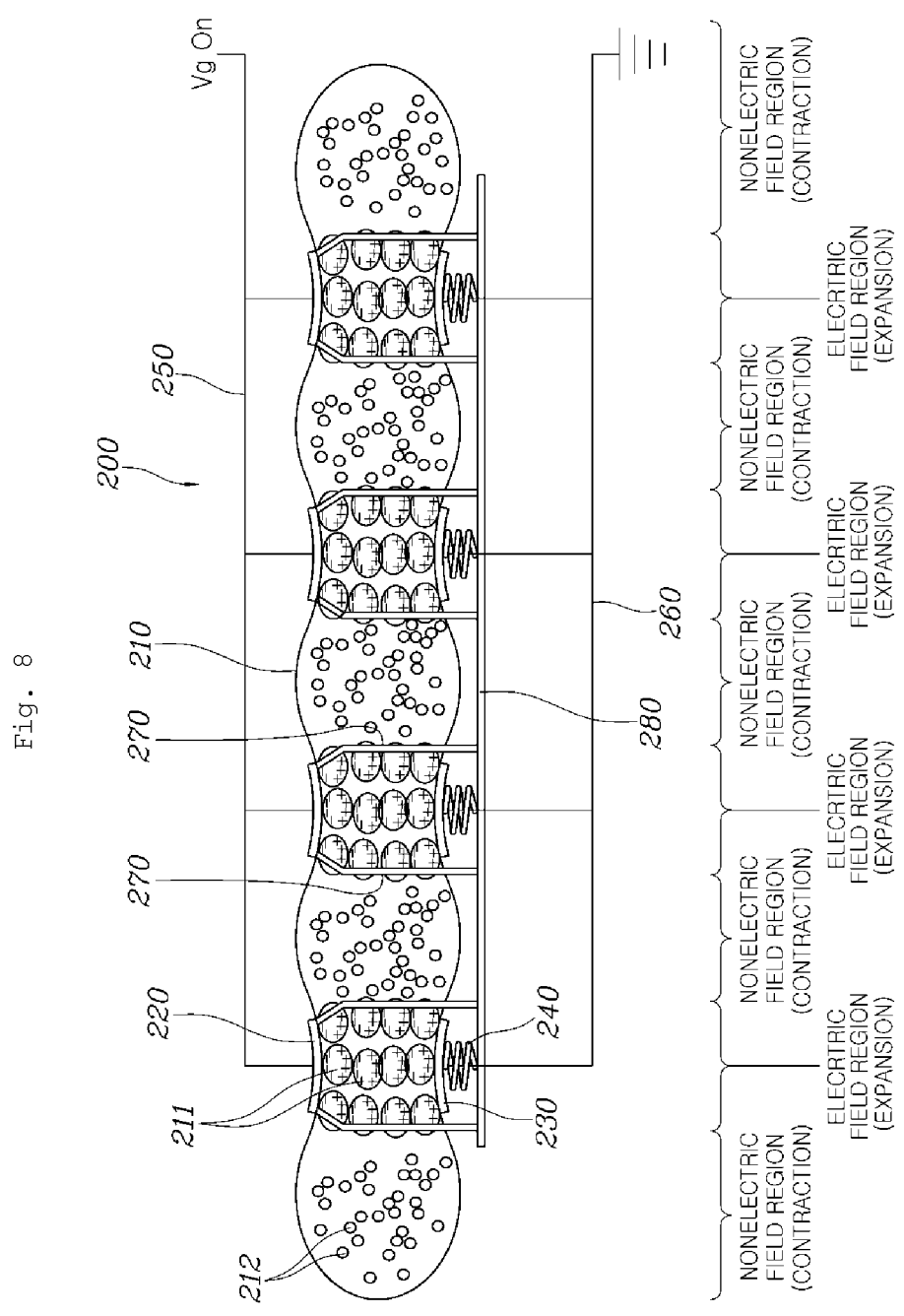
FIG. 8 is a view illustrating a state where the magnetic field is applied to the positive electrodes and the negative electrodes in FIG. 3.

As in FIG. 8, when the current is supplied to the positive electrodes 220 and the negative electrodes 230 and thus the electric field is applied, the ferroelectric particles 211 are pulled toward the positive electrodes 220 and the negative electrodes 230. Thus, the negative (−) components of the ferroelectric particles 211 are arranged in a direction of the positive electrodes 220, the positive (+) components thereof are arranged in a direction of the negative electrodes 230, and the ferroelectric particles 211 are arranged in a row as in the chain structure due to an electrostatic force between the ferroelectric particles 211. Accordingly, a phase of the ferroelectric particle 211 changes from liquid to solid, and thus the electric field region where the positive electrode 220 and the negative electrode 230 are brought into contact with each other expands due to the ferroelectric particle 211 of which the phase changes to solid, and the nonelectric field enters the state of contracting since the nonconductive liquid 212 is pushed toward the nonelectric field region where the positive electrode 220 and the negative electrode 230 are not brought into contact with each other.

Then, the control of current by the high voltage control circuit unit 400 causes the electric field region and the nonelectric field region to repeatedly expand and contract, and thus vibration occurs in the liquid bag 210 and the vibration of the liquid bag 210 propagates to the user 10's neck 11, thereby generating the vibration and providing the acupressure and the massage to the user 10's neck 11.

The electro-liquid driving unit 200 according to the present disclosure may further include an electrode support 270. The electrode support 270 may be connected to the positive electrodes 220 and thus may support the positive electrodes 220. The electrode support 270 restricts expansion displacement of the liquid bag 210 positioned between the positive electrode 220 and the negative electrode 230 when the current is supplied to the positive electrodes 220 and the negative electrodes 230 and thus the electric field is applied.

The electrode support 270 restricts replacement between the positive electrode 220 and the support 280 described below in such a manner that liquid in the electric field region does not expand to a predetermined level or above. Thus, the electrode support 270 causes liquid in the nonelectric field region to expand much more. Particularly, the electrode support 270 supports the positive electrodes 220. The electrode support 270 may be formed of a material, such as nonconductive metal or plastic.

The electro-liquid driving unit 200 according to the present disclosure may further include the support 280. The support 28 may be arranged in the longitudinal direction of the liquid bag 210. The spring 240 and the electrode support 270 may be connected to the support 28. When the electric field is applied to the positive electrodes 220 and the negative electrodes 230 and is no longer supplied thereto, the support 28 serves as a frame that provides a repulsive force against a force from the spring 240 and the electrode support 270 and to support the entire electro-liquid driving unit 200.

The support 280 may be formed in the shape of a bar or as a panel having a predetermined thickness. The support 280 may be maintained bent in the shape of an arc according to the shape of the user 10's neck 11 in a state where the support 280 is mounted into the cushion portion 100. It is desirable that the support 280 is formed of a metal material and to provide a grounding path after being connected to the negative electrodes 220. The low voltage power supply unit 300 is a circuit configured to supply low voltage electricity necessary to drive the electro-liquid driving unit 200 and the high voltage control circuit unit 400. The low voltage power supply unit 300 may be configured to supply a voltage of approximately 12 V to 24 V.

The high voltage control circuit unit 400 may include a high voltage DC-to-DC converter 410, an opto-isolator 420, and a microcontroller 430. The high voltage DC-to-DC converter 410 may be configured to convert low voltage direct current supplied from the low voltage power supply unit 300 into high voltage direct current and supply to the electro-liquid driving unit 200 the drive current necessary to drive the electro-liquid driving unit 200. The opto-isolator 420 allows or blocks a flow of an electric signal using an optical element to allow or block a flow of the high voltage current resulting from the conversion in the high voltage DC-to-DC converter 410. The microcontroller 430 may be configured to generate a control signal for allowing or blocking a flow of micro-current based on a frequency of a signal for the target vibration such that the target vibration occurs in the electro-liquid driving unit 200. The high voltage DC-to-DC converter 410 needs to perform conversion into a high voltage of approximately 2000 V to 8000 V to generate a sufficiently large magnitude of the exciting force. The opto-isolator 420 is also called an opto-couple or the like.

As described above, the neck pillow according to the present disclosure may be installed between the vehicle seat and the headrest and be used to protect the occupant's neck. Alternatively, the neck pillow may be used in everyday life to protect the user's neck. The neck pillow may generate the vibration and provide the smooth comfortable acupressure and massage to the user by controlling the ferroelectric particles, each having the electrorheological property, and the flow of the nonconductive liquid. Particularly, the inconvenience and the sense of uneasiness that the user experiences and mechanical noise may be eliminated since a motor and a mechanical operation mechanism are not used. Thus, the advantage of improving the marketability of the neck pillow may be achieved. In addition, the neck pillow according to the present disclosure is configured to generate the vibration and provide the acupressure and the massage using liquid. Thus, the advantage of providing a sense of soft touch to the user can be achieved.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

What is claimed is:

1. A neck pillow, comprising:

a cushion portion configured to be worn on a neck of a user;

an electro-liquid driving unit including a plurality of positive electrodes and a plurality of negative electrodes, wherein the electro-liquid driving unit is mounted into the cushion portion, bent in a shape of an arc configured to be a shape of the neck to surround the neck, and including ferroelectric particles, each having an electrorheological property, and nonconductive liquid, wherein the ferroelectric particles and the nonconductive liquid are fixed in one space, and wherein the electro-liquid driving unit is configured to generate vibration by contraction and expansion that are repeated when an arrangement of the ferroelectric particles and the nonconductive liquid is changed according to whether drive current is applied;

a low voltage power supply configured to supply low voltage electricity necessary to drive the electro-liquid driving unit; and a high voltage control circuit unit including a processor and configured to convert low voltage direct current of the low voltage power supply into high voltage direct current and to supply the drive current to the electro-liquid driving unit, and to allow or block a flow of current to generate target vibration in the electro-liquid driving unit;

wherein the electro-liquid driving unit includes:

a liquid bag with the ferroelectric particles, each having the electrorheological property, and the nonconductive liquid being mixed in one space in the liquid bag;

the plurality of positive electrodes installed to be brought into contact with a first surface of the liquid bag and arranged at a predetermined distance away from each other along a longitudinal direction of the liquid bag;

the plurality of negative electrodes installed to be brought into contact with a second surface of the liquid bag while facing the plurality of positive electrodes, respectively;

a plurality of springs installed on the plurality of negative electrodes, respectively, for support thereof, being pressed and decreasing in length when current is supplied to the plurality of positive electrodes and the plurality of negative electrodes and thus an electric field is applied, and being released and returning to an original length thereof when the electric field is no longer applied, with the repeated pressing and releasing of the spring causing the liquid bag to repeatedly contract and expand;

a positive electrode lead line connecting the plurality of positive electrodes to the high voltage control circuit unit; and a negative electrode lead line connecting the plurality of negative electrodes to the high voltage control circuit unit.

2. The neck pillow of claim 1, wherein the cushion portion is filled with a forming material made of polymer and a filler made of fiber to provide absorption and support when worn on the neck.

3. The neck pillow of claim 1, wherein the liquid bag is maintained bent in the shape of the arc according to the shape of the neck in a state where the liquid bag is mounted into the cushion portion and is divided into an electric field region where respective ones of the plurality of positive electrodes and the plurality of negative electrodes are brought into contact with each other and a nonelectric field region where respective ones of the plurality of positive electrodes and the plurality of negative electrodes are not brought into contact with each other, with the nonelectric field region being expanded when the current is applied to the plurality of positive electrodes and the plurality of negative electrodes and thus the electric field is applied, bringing the nonelectric field region into contact with the neck.

4. The neck pillow of claim 1, wherein the liquid bag is maintained bent in the shape of the arc according to the shape of the neck in a state where the liquid bag is mounted into the cushion portion and is divided into an electric field region where respective ones of the plurality of positive electrodes and the plurality of negative electrodes are brought into contact with each other and a nonelectric field region where respective ones of the plurality of positive electrodes and the plurality of negative electrodes are not brought into contact with each other, and the electric field region vibrates the neck to increase an exciting force when the current is applied to the plurality of positive electrodes and the plurality of negative electrodes and the electric field is applied, with the plurality of positive electrodes and the plurality of negative electrodes being arranged not to face the neck.

5. The neck pillow of claim 4, wherein, when a state is entered where the current is not supplied to the plurality of positive electrodes and the plurality of negative electrodes, the ferroelectric particles maintain a liquid state, the electric field region where respective ones of the plurality of positive electrodes and the plurality of negative electrodes are brought into contact with each other maintains a state of contracting due to a restoring force of the spring, and the nonelectric field region where respective ones of the plurality of positive electrodes and the plurality of negative electrodes are not brought into contact with each other maintains a state of expanding as much as the electric field region contracts.

6. The neck pillow of claim 5, wherein:

when the current is supplied to the plurality of positive electrodes and the plurality of negative electrodes and the electric field is applied, the ferroelectric particles are pulled toward respective ones of the plurality of positive electrodes and the plurality of negative electrodes, and thus negative (−) components of the ferroelectric particles are arranged in a direction of the plurality of positive electrodes, positive (+) components thereof are arranged in a direction of the plurality of negative electrodes, and the ferroelectric particles are arranged in a row as in a chain structure due to an electrostatic force between the ferroelectric particles, and a phase of the ferroelectric particle changes from liquid to solid, and the electric field region where respective ones of the plurality of positive electrodes and the plurality of negative electrodes are brought into contact with each other expands due to the ferroelectric particle of which the phase changes to solid, and the nonelectric field region enters the state of contracting because the nonconductive liquid is pushed toward the nonelectric field region where respective ones of the plurality of positive electrodes and the plurality of negative electrodes are not brought into contact with each other.

7. The neck pillow of claim 6, wherein adjustment of current by the high voltage control circuit unit causes the electric field region and the nonelectric field region to repeatedly expand and contract, and vibration occurs in the liquid bag and the vibration of the liquid bag propagates to the neck, providing acupressure and massage to the neck.

8. The neck pillow of claim 1, wherein the electro-liquid driving unit further includes:

a plurality of electrode supports, each electrode support connected to a respective electrode of the plurality of positive electrodes and supporting the respective electrode of the plurality of positive electrodes and restricting expansion displacement of the liquid bag positioned between the plurality of positive electrodes and the plurality of negative electrodes when the current is supplied to the plurality of positive electrodes and the plurality of negative electrodes and the electric field is applied.

9. The neck pillow of claim 8, wherein the plurality of electrode supports are formed of any one of nonconductive metal or plastic.

10. The neck pillow of claim 8, wherein the electro-liquid driving unit further includes:

a support arranged in the longitudinal direction of the liquid bag and operates as a frame that provides a repulsive force against a force from the plurality of springs and the plurality of electrode supports and to support the entire electro-liquid driving unit when the electric field is applied to the plurality of positive electrodes and the plurality of negative electrodes and is no longer supplied thereto, with the spring and the electrode support being connected to the support.

11. The neck pillow of claim 10, wherein the support is formed in a shape of a bar or as a panel having a predetermined thickness and is maintained bent in the shape of the arc according to the shape of the neck in a state where the support is mounted into the cushion portion, with the support being formed of a metal material and providing a grounding path after being connected to the plurality of negative electrodes.

12. The neck pillow of claim 1, wherein the high voltage control circuit unit includes:

a high voltage DC-to-DC converter configured to convert low voltage direct current supplied from the low voltage power supply into high voltage direct current and to supply to the electro-liquid driving unit the drive current necessary to drive the electro-liquid driving unit;

an opto-isolator allowing or blocking a flow of an electric signal using an optical element to rapidly allow or block a flow of the high voltage current resulting from the conversion in the high voltage DC-to-DC converter; and a microcontroller configured to generate a control signal for allowing or blocking a flow of micro-current in accordance with a frequency of a signal for the target vibration for the target vibration to occur in the electro-liquid driving unit.

13. The neck pillow of claim 1, the neck pillow is a vehicle neck pillow mounted between a vehicle seat and a headrest or as a neck pillow mounted on a chair for massage.

14. The neck pillow of claim 1, wherein the current is a micro-current.

\* \* \* \* \*